United States Patent [19]

Konrad

[11] Patent Number: 4,868,521

[45] Date of Patent: Sep. 19, 1989

[54] METHOD AND CIRCUIT FOR EXCITING AN ULTRASONIC GENERATOR AND THE USE THEREOF FOR ATOMIZING A LIQUID

[75] Inventor: Manfred Konrad, Opfikon-Glattbrugg ZH, Switzerland

[73] Assignee: Satronic, AG, Opfikon-Glattburg ZH, Switzerland

[21] Appl. No.: 232,731

[22] Filed: Aug. 16, 1988

[30] Foreign Application Priority Data

Aug. 17, 1987 [CH] Switzerland ........................ 3155/87

[51] Int. Cl.[4] ........................ H03L 7/06; H03L 7/08; H03L 7/12; H01L 41/08

[52] U.S. Cl. ........................ 331/1 R; 331/4; 331/65; 331/158; 310/316

[58] Field of Search ........................ 331/1 R, 4, 10, 11, 331/15, 17, 65, 116 R, 154, 158; 310/316, 317, 318; 239/102.2

[56] References Cited

U.S. PATENT DOCUMENTS

| | | | |
|---|---|---|---|
| 3,432,691 | 3/1969 | Shoh | 310/316 |
| 3,975,650 | 8/1976 | Payne | 310/316 |
| 4,445,064 | 3/1984 | Bullis | 310/316 |
| 4,562,413 | 12/1985 | Mishiro et al. | 331/17 X |
| 4,583,529 | 3/1986 | Briggs | 128/24 A |

FOREIGN PATENT DOCUMENTS

| | | |
|---|---|---|
| 2338503 | 2/1974 | Fed. Rep. of Germany . |
| 3013964 | 10/1981 | Fed. Rep. of Germany . |
| 0415137 | 1/1962 | Switzerland . |

*Primary Examiner*—David Mis
*Attorney, Agent, or Firm*—Helegott & Karas

[57] ABSTRACT

A method and a circuit for exciting an ultrasonic generator comprises a control loop which includes the ultrasonic generator itself and a voltage-controlled oscillator. The control loop keeps the active power consumption to a desired value, which is compared in a comparator with the instantaneous active power consumption. One output of a further rectangular oscillator is connected to the control input of the voltage-controlled oscillator. The rectangular oscillator is put into operation if in the control loop there are no control oscillations or only those which are smaller than a predetermined threshold. The output of the rectangular oscillator is connected across one diode to the control input of the voltage-controlled oscillator and across another diode to the controlled input of comparator. The additional signal is applied to the voltage-controlled oscillator, apart from the control signal of the control loop. The cycle of the additional signal is longer than the change time constant at the control input of the voltage-controlled oscillator and the additional signal swing is selected in such a way that the frequency of oscillator passes through a predetermined frequency range.

8 Claims, 2 Drawing Sheets

METHOD AND CIRCUIT FOR EXCITING AN ULTRASONIC GENERATOR AND THE USE THEREOF FOR ATOMIZING A LIQUID

BACKGROUND OF THE INVENTION

This invention relates to a method and a circuit for exciting an ultrasonic generator and the use thereof for atomizing a liquid.

The possibility of atomizing liquids with the aid of piezoelectric ultrasonic generators is known. For example, the article by W. D. Drews "Flussigkeitszerstaubung durch Ultraschall" ("Liquid Atomization by Ultrasonic Energy") in "Elektronik" (1979), No. 10, pp. 83–90 briefly describes the principle of this method. An ultrasonic generator is utilized which is equipped with an atomizer disk or plate and a circuit for exciting this ultrasonic generator.

However, the technical realization of the atomization of a liquid using an ultrasonic generator has been difficult due to a number of problems.

An atomization is only possible close to the resonance of an ultrasonic generator (together with its atomizer disk), and the necessary exciting frequency must be very precisely maintained. The locking of the oscillator of the exciting circuit to an apparent resonance, which does not correspond to an effective atomization must be reliably prevented.

The exciting circuit must be in a position to detect changes in the necessary exciting frequency as a function of different parameters. Such parameters are e.g. the manufacturing tolerances of the mechanical components of the ultrasonic generator (particularly its atomizer disk), the variations in the mechanical and electrical parameters of the piezoelectric ceramic used in its manufacture, the operating temperature of the ultrasonic generator (very important when used in burners), the aging of the ultrasonic generator, deposits formed thereon (such as e.g. soot and resins when used in burners) and the manufacturing adjustment and other tolerances in the exciting circuit.

Reliable detection of a stoppage of atomization must be ensured. If stoppage is caused by droplets which have stuck to the atomizer disk, the centrifuging of these droplets from the disk must be ensured.

A practical requirement with respect to industrial use is the interchangeability of the exciting circuit and the ultrasonic generator itself or optionally its atomizer disk and namely without any matching or adapting and without high tolerance requirements on the replacement parts of spares.

To achieve the best possible efficiency the atomizing capacity of the ultrasonic generator or its atomizer disk must be automatically regulatable, without any action by an operator and without having to change e.g. the exciting voltage or the duty cycle of the drive frequency.

Numerous methods and circuits have already been proposed for solving these problems.

DE-3222425 proposes exciting the ultrasonic generator across a matching network, which inter alia serves to suppress the starting of oscillation of the ultrasonic generator to harmonics of its resonant frequency. The direct current component of the resonator current is used for regulating the exciting current and the alternating current component of the resonator current is used for regulating the exciting frequency, a band pass filter only permitting the passage of the frequency component at the desired resonant frequency of the ultrasonic generator. In the case of a resonance failure the exciting frequency is wobbled or swept, in order to pass through the resonance point and to obtain relocking. It is a disadvantage of the solution that the circuit is matched to the ultrasonic generator and particularly to its desired resonant frequency, so that the operation of the ultrasonic generator cannot follow the changes in certain of the aforementioned parameters and also the easy interchangeability of components is not ensured. A reliable operation is not ensured in the case of oscillation starting, particularly under load and with varying operating conditions, because the impedance and therefore the phase relationships between the current and the voltage of the ultrasonic generator vary considerably in the case of load changes and consequently it is not possible to track the optimum oscillating frequency, derived from the phase relationship between the current and the voltage in the ultrasonic generator. A true compensation of the capacitance of the ultrasonic generator by means of its inductance is not possible due to the capacitance changing during load changes.

With a somewhat different construction much the same is proposed in U.S. Pat. No. 4,275,363, wherein the same, aforementioned disadvantages occur.

DE-3314609 proposes operating the ultrasonic generator with timed bursts using different values thereof in each case. However, it is disadvantageous for the frequency matching and the control of the bursts to use the free dying out of an oscillation instead of the resonance behavior of the ultrasonic generator, because then it is not possible to obtain values varying in linear manner with the actual state.

In a somewhat different construction much the same is proposed in DE-3401735 wherein, also, the same, aforementioned disadvantages occur.

DE-3534853 proposes operating the ultrasonic generator with timed bursts and to carry out a current measurement during specific times for automatic frequency matching purposes. The necessary intermediate storage of the current measurement value and the precise synchronization of the measurement and control sequences are disadvantageous and, in particular, costly.

SUMMARY OF THE INVENTION

It is an object of the present invention to provide an improved method and circuit for exciting an ultrasonic generator, which would avoid the aforementioned disadvantages.

Yet another object of the invention is to provide a method and circuit for exciting an ultrasonic generator, particularly used for the liquid automization, which would substantially reduce costs of conventional methods and circuits of the foregoing type.

These and other objects of the invention are attained by a method for exciting an ultrasonic generator, comprising the steps of providing a voltage-controlled oscillator and exciting a frequency at its output, a control loop adjusting the active power at the ultrasonic generator by means of the exciting frequency between a series resonance and a parallel resonance of the ultrasonic generator, wherein, in addition to a regulating signal of the control loop, a periodic additional signal is applied to the voltage-controlled oscillator if no control oscillations or control oscillations appear in the control loop, which are below a predetermined threshold, the cycle of the additional signal being longer than a change time constant of the signal applied to the control input of the voltage-controlled oscillator and the additional signal swing is dimensioned in such a way that the frequency of the voltage-controlled oscillator passes through a predetermined frequency range, the middle value of which is roughly at the frequency of the series resonance and the width of which is approximately twice the frequency spacing between the series resonance and the parallel resonance.

DETAILED DESCRIPTION OF THE PREFERRED EMBODIMENT

Figure 1:
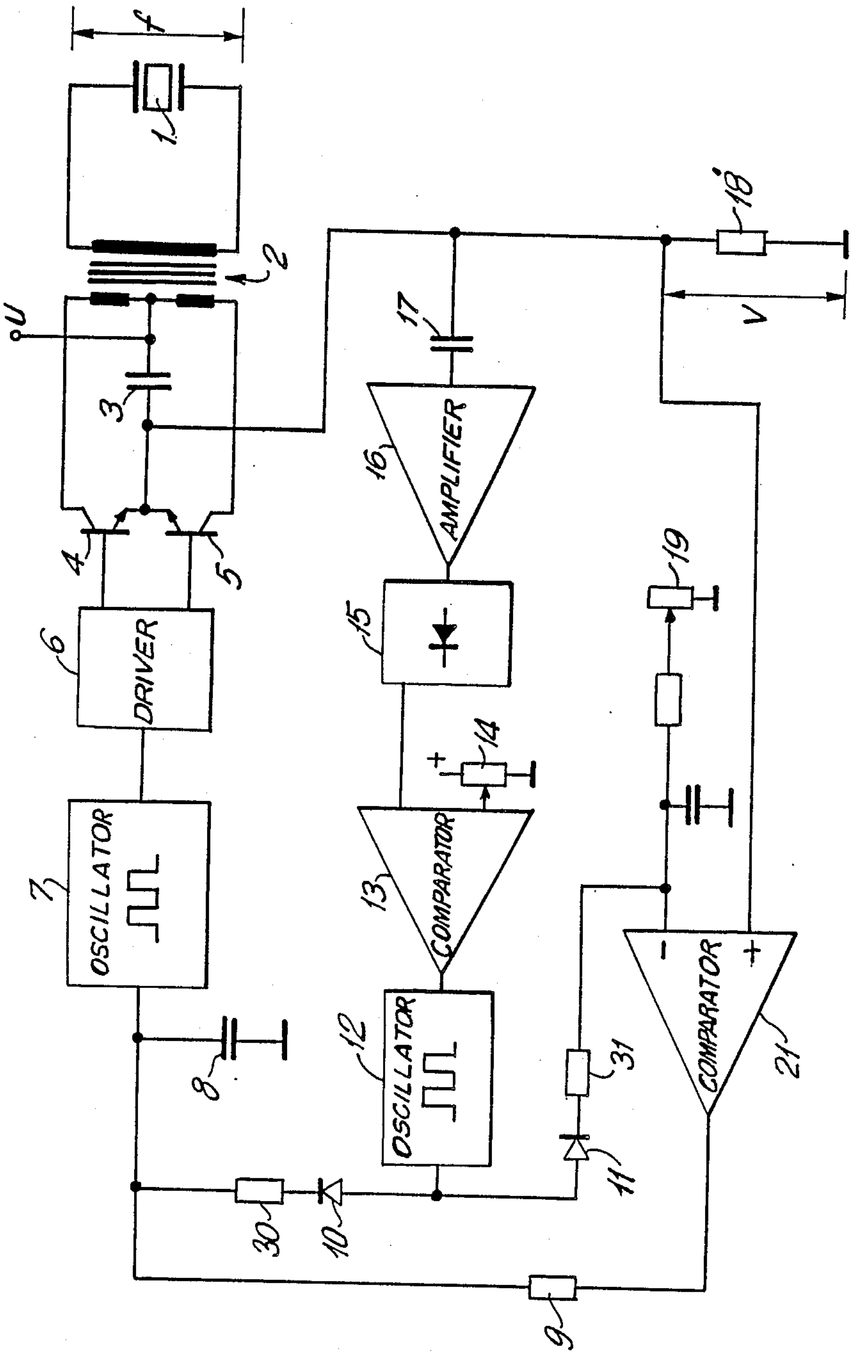
FIG. 1 is a block circuit diagram of an inventive circuit for exciting an ultrasonic generator.

The ultrasonic generator exciting circuit shown in FIG. 1 comprises an ultrasonic generator 1 (whose per se known) the atomizer disk or plate of which is known per se and not shown. The ultrasonic generator 1 is excited across a transformer 2, which ensures a galvanic isolation of generator 1 and optionally (as a function of its turns ratio) permits the excitation with different voltage values of the power source U. Two transistors 4, 5 form a pushpull output stage of the circuit and alternately switch through the power source U to in each case half of the primary winding of transformer 2.

The exciting circuit is closed across a precision resistor 18. A capacitor 3 directly returns the current changes from transistors 4 and 5 to the power source U and consequently ensures that the voltage drop v occurring at the precision resistor 18 has a d.c. voltage component, which is proportional to the direct current consumption of the output stage. A driver 6 supplies the signals in proper phase necessary for transistors 4 and 5. The voltage-controlled oscillator 7 generates the frequency f, with which the excitation of ultrasonic generator 1 takes place.

As the losses in transistors 4 and 5, in transformer 2, in capacitor 3 and the losses in the secondary coil of transformer 2 caused by reactive currents (as a result of the generator capacitance) can be kept sufficiently small, the d.c. voltage drop at resistor 18 is a direct measure for the active power consumed by the ultrasonic generator 1. This is in turn a usuable measure of the liquid atomizing capacity.

Figure 2:
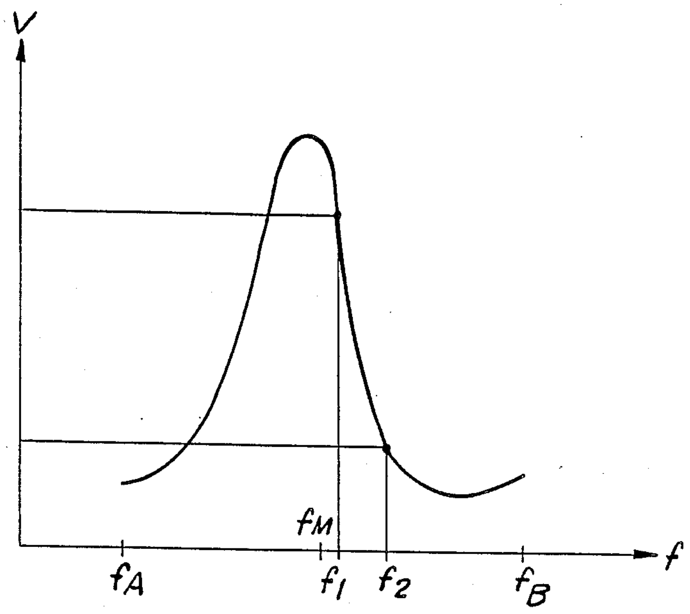
FIG. 2 is a graph showing the course of the voltage on a precision resistor shown in FIG. 1 as a function of the exciting frequency of the ultrasonic generator.

FIG. 2 shows the course of the d.c. voltage component, i.e. optionally the mean time value of the voltage V at precision resistor 18, i.e. also the course of the active power consumed by ultrasonic generator 1 as a function of the oscillating frequency f of generator 1. On the abscissa are plotted the oscillating frequencies f and on the ordinate, the voltage V measured at precision resistor 18. The characteristic curve shown in FIG. 2 corresponds to the good known impedance course (or reactance course) of a resonance system, such as that of a piezoelectric generator. The maximum shown in FIG. 2 corresponds to the series resonance obtained from the known equivalent circuit diagram of a generator and the minimum corresponds to the parallel resonance occurring with the same equivalent circuit diagram. The ratio between maximum and minimum is essentially established by the impedance behavior of the ultrasonic generator 1. Between the maximum and the minimum is located the falling edge or side of the characteristic curve, on which e.g. at a frequency $f_1$, a large atomizing capacity is obtained, whereas at a frequency $f_2$ a small atomizing capacity is obtained. All the exciting frequencies, which lead to resonances of the ultrasonic generator 1 during the practical operation thereof, are located between a lower cut-off frequency $f_A$ and an upper cut-off frequency $f_B$, whose mean value $f_M=(f_A+f_B)/2$ is in the vicinity of the maximum active power.

Oscillator 7 in FIG. 1 is a voltage-controlled oscillator constructed with commercially available components. The permitted voltage swing at its control input is predetermined and the corresponding frequency swing on its frequency output is adjustable in known manner through the value of resistors and/or capacitors connectable to oscillator 7 and not shown in FIG. 1.

The voltage V tapped at the precision resistor 18 is compared with a voltage in comparator 21 adjustable on a potentiometer 19. The output signal of comparator 21 is smoothed by the RC network formed by a resistor 9 and a capacitor 8 and is supplied to the oscillator 7 as a control voltage. Thus, with potentiometer 19 it is possible to set and maintain a clearly defined operating point on one side of the characteristic curve of FIG. 2. Oscillator 7, driver 6, transistors 4, 5, capacitor 3, transformer 2, resistor 18, comparator 21, resistor 9 and capacitor 8 together form the regulator and, together with the latter, a regulating section provided through the ultrasonic generator 1 forms a control loop.

Oscillator 7 is now set in such a way that with the control voltage swing which can be produced by comparator 21 at its controlled input, (i.e. also at capacitor 8), it is only possible to produce frequencies between $f_A$ and $f_B$, i.e. only in a narrow range around the series resonance and the parallel resonance. It is even better if the frequencies, which can be produced, are in a range, which is within the range between the series resonance and the parallel resonance and is significantly smaller, such as e.g. the range between $f_1$ and $f_2$. The locking of the generator circuit to additional resonances, which can result from a matching between the transformer 2 and the ultrasonic generator 1 and which do not lead to an effective atomization is consequently prevented. Thus, a special matching between the transformer 2 and the ultrasonic generator 1 is neither necessary, nor desired and consequently there is also no need for a filter in a resonance detection circuit.

The large gain at comparator 21 gives in conjunction with the control voltage swing produceable by it a two-positioned control. Thus, the ultrasonic generator 1 is only operated at a frequency corresponding to a predetermined desired active power consumption. Moreover, due to the two-position control characteristic, the operation of the ultrasonic generator 1 is only possible at one of the two frequencies corresponding to the desired active power consumption (e.g. on the higher frequency side of the characteristic curve shown in FIG. 2 and at frequency $f_1$).

The above-defined control loop is designed in such a way that clearly defined control oscillations occur. This is essentially achieved in that the control voltage swing produced by comparator 21 is only incompletely smoothed by the RC network formed by resistor 9 and capacitor 8. The corresponding control oscillations, which are shown by a sweep of the exciting frequency and the oscillating frequency f of the ultrasonic generator 1 and consequently an a.c. voltage component superimposed on the d:c. voltage component in the voltage drop V occurring at the precision resistor 18, are given by the cooperation of the aforementioned RC network formed by resistor 9 and capacitor 8 with the precision resistor 18 and capacitor 3, as well as the gain at comparator 21 and the active power characteristic curve of the ultrasonic generator 1.

As the ultrasonic generator 1 is an integral component of the control loop, said control oscillations can only occur if the generator 1 has the characteristic curve shown in FIG. 2. This is only the case when it is correctly atomizing. If it is excessively damped by droplets which have stuck, then it cannot have a marked resonance behavior in accordance with the characteristic curve of FIG. 2 and then the control oscillations either do not occur, or occur in a very weak and irregular manner.

Thus, the appearance of clearly defined control oscillations of the control loop can be looked upon as a reliable criterion for a correct atomization. In order to be able to detect these control oscillations, the a.c. voltage component in the voltage drop V occurring at the precision resistor 18 is decoupled through a capacitor 17 and amplified by an amplifier 16. A rectifier 15 supplies a d.c. voltage as a measure of the amplitude of the amplified control oscillations. A comparator 13 decides by comparing this d.c. voltage with a desired voltage adjustable by a potentiometer 14 whether the control oscillations are sufficiently large. If the control oscillations are not present or are too weak (which e.g. occurs on switching on the generator), then an oscillator 12, which in the present example is a rectangular oscillator, is started, so that alternately a higher and a lower voltage appears at its output. However, if the control oscillations are sufficiently large, then the oscillator 12 is switched off or remains switched off and is decoupled from the control loop by diodes 10 and 11.

When the higher voltage appears at the output of oscillator 12 by means of diode 10 and a resistor 30 the control voltage at the control input of oscillator 7 (i.e. also at capacitor 8) is raised, so that after a time constant given by resistor 9, resistor 30 and capacitor 8, oscillator 7 produces the upper cut-off frequency $f_B$. Simultaneously the desired current requirement at the input of comparator 21 is raised across the diode 11 and a resistor 31. This forces an operating point of ultrasonic generator 1 in the upper region of the characteristic curve of FIG. 2. During the following appearance of the lower voltage at the output of oscillator 12 the latter is decoupled across diodes 10 and 11 from the control loop. Capacitor 8 discharges across the resistor 9, because the desired voltage at comparator 21 is higher at this time than the actual voltage and therefore the comparator output carries the lower output voltage (the desired voltage is at the inverting input). Thus, the frequency produced by oscillator 7 drops from $f_B$ towards $f_A$. The cycle of oscillator 12 compared with the time constant of the discharge of capacitor 8 is chosen sufficiently large to ensure that there is a passage through the full frequency range between $f_B$ and $f_A$.

For as long as the cause of the detuning of ultrasonic generator 1 is not removed, (for as long as generator 1 is not locked on the exciting frequency or the stuck droplet has still not been shook off), a frequency sweep takes place between $f_B$ and $f_A$. If the droplet has been shook off and ultrasonic generator 1 achieves a resonance behavior according to the characteristic curve of FIG. 2 or optionally re-achieves it, then the control oscillations appear, oscillator 12 is switched off (its output is set to the lower voltage) and is decoupled from the control loop through diodes 10 and 11.

A power regulation at the ultrasonic generator 1 takes place in that the oscillating frequency f of generator 1 defined by the exciting frequency is displaced between the series resonance and the parallel resonance. The smallest atomizing capacity is obtained on exciting in parallel resonance (large reactive power, low active power) and the maximum atomizing capacity is obtained at series resonance (small reactive power and large active power). Thus, neither the exciting voltage, nor the duty cycle have to be changed for regulating the power.

The invention has been described hereinbefore in connection with an ultrasonic generator, particularly a piezoelectric ultrasonic generator, whose use is e.g. in the field of liquid atomization. However, the invention can also be used on other resonance systems, whose resonance takes place in a narrow frequency band and consequently changes strongly as a function of a physical quantity, said quantity having to be maintained as precisely as possible. Thus, the invention is generally suitable for maintaining constant a physical quantity by means of a control loop, which comprises a reasonatable body, whose resonance behavior in a narrow frequency band is greatly influenced by the physical quantity and is used for detecting changes thereof.

What is claimed is:

1. Method for exciting an ultrasonic generator comprising the steps of providing a control loop including the ultrasonic generator and a voltage-controlled oscillator, exciting the ultrasonic generator by a frequency of an output signal of the voltage-controlled oscillator, and adjusting an active power at the ultrasonic generator by the control loop by an exciting frequency between a series resonance and a parallel resonance of the ultrasonic generator, wherein in addition to a regulating signal of the control loop, a periodic additional signal is applied to the voltage-controlled oscillator if no control oscillations or control oscillations which are below a predetermined threshold occur in the control loop, a cycle of the additional signal being longer than a change time constant of the signal applied to a control input of the voltage-controlled oscillator, and an additional signal swing is dimensioned in such a way that the frequency of the voltage-controlled oscillator passes through a predetermined frequency range, a middle value of which is roughly at the frequency of the series resonance and a width of which is approximately twice the frequency spacing between the series resonance and the parallel resonance.

2. Method according to claim 1, wherein a frequency swing of the voltage-controlled oscillator produceable by the control loop alone is smaller than the frequency spacing between the frequency of the resonance to be used and the frequency to the closest resonance.

3. Method according to claim 1, wherein a voltage applied to the ultrasonic generator by the control loop has a constant amplitude.

4. Method according to claim 2, wherein a voltage applied to the ultrasonic generator by the control loop has a constant value.

5. The method according to claim 1, wherein said ultrasonic generator is provided with an atomizing disk and wherein said ultrasonic generator with said atomizing disk is utilized for atomizing a liquid.

6. Circuit for exciting an ultrasonic generator, comprising a control loop including said ultrasonic generator and a voltage-controlled oscillator operatively connected to said ultrasonic generator to excite the ultrasonic generator by a frequency of an output signal of the voltage-controlled oscillator, said control loop maintaining constant an active power consumption of the ultrasonic generator to a desired value, a comparator connected to said voltage-controlled oscillator and comparing said desired value with an instantaneous power consumption of the ultrasonic generator, and an additional oscillator having an input connected to said comparator and an output connected to a control input of said voltage-controlled oscillator, said control loop further including a first diode and a second diode, said additional oscillator being connected in said control loop in such a way that it is put into operation if no control oscillations or only such oscillations which are smaller than a predetermined threshold occur in the control loop, and the output of said additional oscillator being connected to the control input of the voltage-controlled oscillator across said one diode and to the control input of said comparator across said another diode.

7. Circuit for exciting an ultrasonic generator according to claim 6, wherein said control loop further includes a transformer and a driver interconnected between said ultrasonic generator and said voltage-controlled oscillator.

8. Circuit for exciting an ultrasonic generator according to claim 7, wherein said additional oscillator is a rectangular oscillator.

* * * * *